(12) United States Patent
Ema et al.

(10) Patent No.: US 6,850,688 B2
(45) Date of Patent: Feb. 1, 2005

(54) VARIABLE-WAVELENGTH LIGHT SOURCE UNIT

(75) Inventors: Nobuaki Ema, Tokyo (JP); Hiroki Saito, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 274 days.

(21) Appl. No.: 10/114,592

(22) Filed: Apr. 2, 2002

(65) Prior Publication Data

US 2002/0141727 A1 Oct. 3, 2002

(30) Foreign Application Priority Data

Apr. 2, 2001 (JP) .................................. P. 2001-103490

(51) Int. Cl.[7] .............................................. G02B 6/00
(52) U.S. Cl. ..................... 385/140; 356/327; 356/364
(58) Field of Search ............................ 385/92, 94, 88, 385/14; 356/327, 364

(56) References Cited

U.S. PATENT DOCUMENTS

| 5,822,063 | A | * | 10/1998 | Suzuki et al. | 356/364 |
| 6,069,697 | A | * | 5/2000 | Tanimoto et al. | 356/327 |
| 6,144,793 | A | * | 11/2000 | Matsumoto et al. | 385/140 |

* cited by examiner

*Primary Examiner*—Vip Patel
*Assistant Examiner*—Sumati Krishnan
(74) *Attorney, Agent, or Firm*—Fish & Richardson P.C.

(57) ABSTRACT

A variable-wavelength light source unit for sending output light of an arbitrary wavelength selected in a variable-wavelength light source section 1 has an optical variable attenuator 2 placed on the output side of the variable-wavelength light source section and a control circuit 4 for controlling the attenuation amount of the optical variable attenuator in response to light output provided by splitting a part of the output light.

7 Claims, 2 Drawing Sheets

VARIABLE-WAVELENGTH LIGHT SOURCE UNIT

BACKGROUND OF THE INVENTION

1. Field of the Invention

This invention relates to a variable-wavelength light source unit used for evaluating and manufacturing an optical communication system and an optical device.

2. Description of the Related Art

A variable-wavelength light source unit in the related art will be discussed with reference to FIG. 2.

In FIG. 2, the variable-wavelength light source unit in the related art is surrounded by the dotted line.

The variable-wavelength light source unit includes a variable-wavelength light source section 11, a photocoupler 13, an optical power monitor PD (photodiode) 17, and a drive current control circuit 14.

In the configuration in FIG. 2, output of the variable-wavelength light source section 11 is emitted through the photocoupler 13 from an output section of the light source unit.

A part of output light split by the photocoupler 13 is fed into the optical power monitor PD (photodiode) 17.

Output of the power monitor PD 17 is fed into the drive current control circuit 14, which then controls the drive current of the variable-wavelength light source section 11 in response to the output of the power monitor PD 17, thereby controlling the light output from the output section of the light source unit constant.

The variable-wavelength light source section 11 has a configuration as shown in FIG. 3.

In FIG. 3, numeral 31 denotes an LD (laser diode). Light produced by making an electric current flow into the laser diode 31 is made incident on a diffraction grating 33 through a lens 32 at a predetermined incidence angel.

Specific-wavelength light of the light incident on the diffraction grating 33 is reflected on a reflector (mirror) 34 and is output again through the diffraction grating 33, the lens 32, the laser diode 31, and a lens 36.

In the configuration in FIG. 3, the output wavelength is selected as the angle of the mirror 34 is adjusted by a motor 35.

However, the light output characteristic of the variable-wavelength light source section 11 in FIG. 3 has wavelength dependency in which output power Pout of the output light changes depending on the wavelength of the output light as indicated by the dotted line in (2-a) of FIG. 2 (if the drive current of the laser diode 31 is made constant).

It is desirable that the output characteristic of the variable-wavelength light source should be a flat characteristic independent of the wavelength, as indicated by the solid line.

It is considered that the cause may be the effect of change in the control characteristic of the control system caused by fluctuation of ambient temperature, refractive index change caused by local temperature change of the laser diode caused by the electric current flowing into the laser diode, etc.

Hitherto, to provide the flat characteristic as indicated by the solid line in (2-a) of FIG. 2 without wavelength dependency that the output light power of the laser diode changes depending on the wavelength as indicated by the dotted line in (2-a) of FIG. 2, a part of output light has been fed back for controlling the drive current of the laser diode.

However, in the technique in FIG. 2, to correct the wavelength and output level, the drive current of the laser diode is controlled, resulting in a factor impairing the stability of the output light wavelength.

Particularly, to correct the wavelength dependency of the light output level, the drive current value of the laser diode is changed and thus providing a wide range of wavelengths is also inhibited.

SUMMARY OF THE INVENTION

It is an object of the invention to provide stable light output wavelength accuracy over a wide range of wavelengths while the light output level of a variable-wavelength light source unit is kept constant.

According to the invention, there is provided a variable-wavelength light source unit for sending output light of an arbitrary wavelength selected in a variable-wavelength light source section 1, the variable-wavelength light source unit comprising:

an optical variable attenuator on the output side of the variable-wavelength light source section; and a control circuit (optical variable attenuator control circuit) for controlling the attenuation amount of the optical variable attenuator in response to light output provided by splitting a part of the output light. Thus, the variable-wavelength light source unit that can provide stable light output wavelength accuracy over a wide range of wavelengths while the light output level of the variable-wavelength light source unit is kept constant can be provided.

A semiconductor laser diode of the variable-wavelength light source section is driven by a constant current, whereby the drive current value of the semiconductor laser diode is constant, so that providing a wide range of wavelengths is not inhibited.

The control circuit performs feedback control in response to output light split by a photocoupler and includes a compensator for canceling out wavelength dependency of a feedback system. Thus, the wavelength dependency caused by the effect of the photocoupler 3, optical power monitor PD 7, etc., can be canceled out.

A characteristic for canceling out the wavelength dependency of the photocoupler and an optical power monitor photodiode forming the feedback system by the compensator is previously stored in a table. Thus, the wavelength dependency of the photocoupler 3, the optical power monitor PD 7, etc., can be easily canceled out.

To change the attenuation amount in the optical variable attenuator, the magnitude of the voltage superposed on the control voltage can also be changed for changing the level of the output light.

A photoelectric effect element of voltage applying drive type is used as the optical variable attenuator, whereby as compared with an optical variable attenuator having a mechanical structure, the photoelectric effect element can react to applied voltage change at high speed in light attenuation amount change.

Thus, if the wavelength sweeping of the variable-wavelength light source is speeded up, it is made possible to correct the wavelength dependency following the speed, and the measuring time can be shortened.

DETAILED DESCRIPTION OF THE PRESENT INVENTION

The present invention will be described with reference to the accompanying drawings. A variable-wavelength light source unit of the invention will be discussed with reference to FIG. 1.

Figure 1:
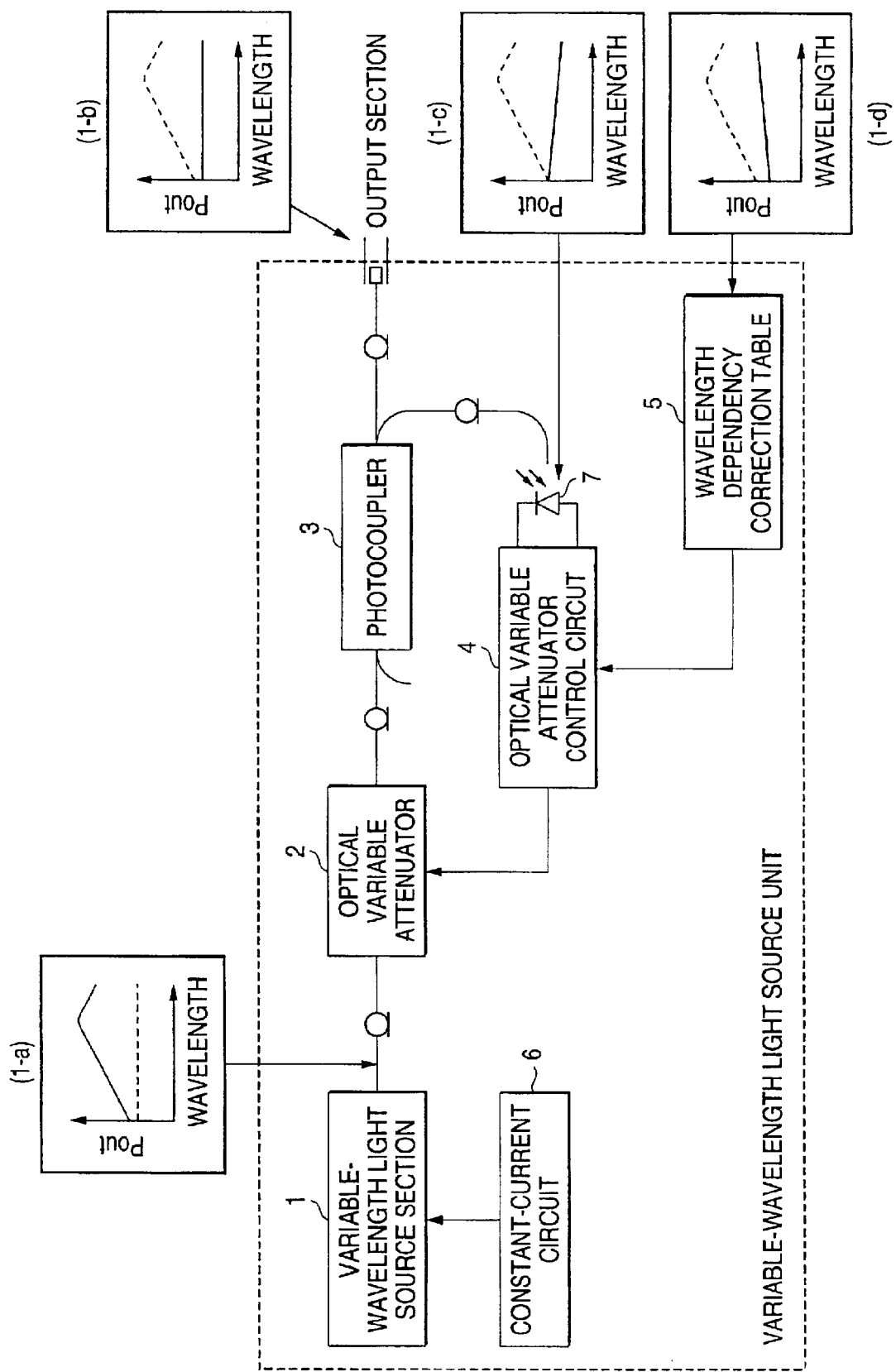
FIG. 1 is a drawing to show the configuration of a variable-wavelength light source unit of the invention.

In FIG. 1, the variable-wavelength light source unit of the invention is surrounded by the dotted line.

The variable-wavelength light source unit includes a variable-wavelength light source section 1, a constant-current circuit 6, an optical variable attenuator 2, a photocoupler 3, an optical power monitor PD (photodiode) 7, a wavelength dependency correction table 5, and an optical variable attenuator control circuit 4.

In the configuration in FIG. 1, the variable-wavelength light source section 1 is driven by the constant-current circuit 6. Output of the variable-wavelength light source section 1 is emitted through the optical variable attenuator 2 and the photocoupler 3 to the outside.

The optical variable attenuator 2 attenuates (controls) the light output from the variable-wavelength light source section 1 in response to the level of the output light split by the photocoupler 3 and the attenuation amount is changed in response to the voltage from the optical variable attenuator control circuit 4.

The optical variable attenuator control circuit 4 detects a part of the output light split by the photocoupler 3 through the optical power monitor PD 7 The optical power monitor PD 7 converts the split light by the photo coupler 3 into an electric signal in proportion to the level of the split light. The optical variable attenuator control circuit 4 outputs an electrical signal for controlling the output light of the optical variable attenuator 2 based on the electric signal received from the optical power monitor PD 7. The optical variable attenuator control circuit 4 supplies the electric signal to the optical variable attenuator 2 so that the output light power becomes constant.

The wavelength dependency correction table 5 is a correction table used to correct the wavelength dependency containing the photocoupler 3 and the optical power monitor PD 7 when the control voltage to the optical variable attenuator 2 is generated.

Figure 3:
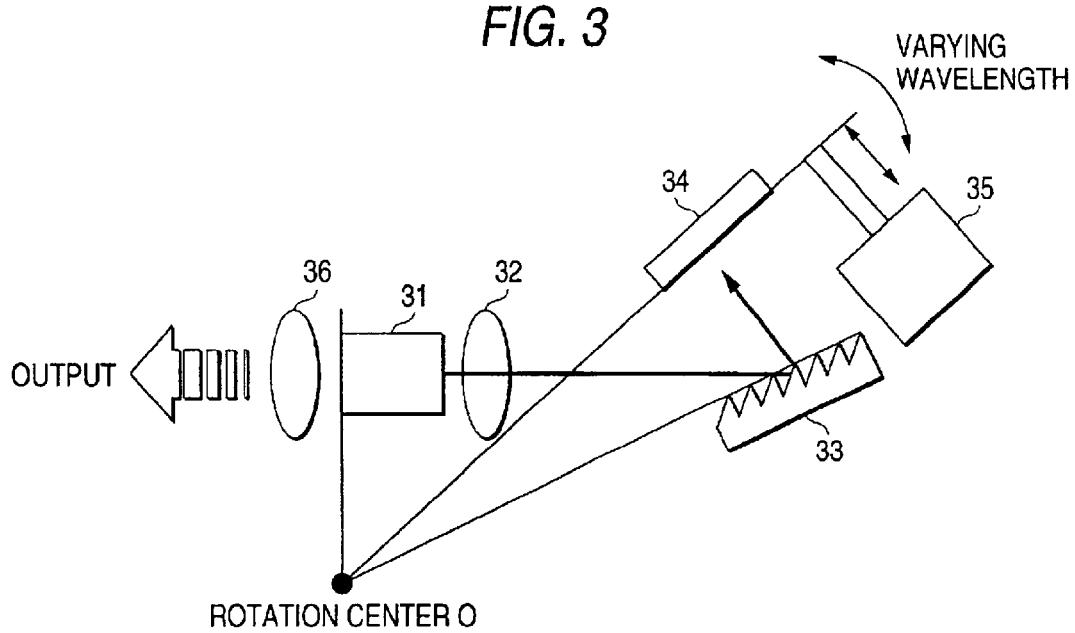
FIG. 3 is a drawing to show the configuration of a variable-wavelength light source section.

The variable-wavelength light source section 1 has the configuration shown in FIG. 3. in which numeral 31 denotes an LD (laser diode). Light produced by making an electric current flow into the laser diode 31 is made incident on a diffraction grating 33 through a lens 32 at a predetermined incidence angel.

Specific-wavelength light of the light incident on the diffraction grating 33 is reflected on a reflector (mirror) 34 and is output again through the diffraction grating 33, the lens 32, the laser diode 31, and a lens 36.

In the configuration in FIG. 3, the output wavelength is selected in accordance with the angle of the mirror 34 adjusted by a motor 35.

Next, operation of the variable-wavelength light source unit of the invention described with reference to FIG. 1 is as follows:

The characteristic of the light output power output from the variable-wavelength light source section 1 relative to the wavelength in FIG. 1 has wavelength dependency as indicated by the solid line in (1-*a*) of FIG. 1 if the laser diode is only driven by the constant-current circuit 6.

It is assumed that the wavelength dependency containing the photocoupler 3 and the optical power monitor PD 7 is a characteristic as indicated by the solid line in (1-*c*) of FIG. 1.

In this case, a characteristic indicated by the solid line in (1-*d*) of FIG. 1 (inverse characteristic) is preset in the wavelength dependency correction table 5 to make flat the characteristic containing the photocoupler 3 and the optical power monitor PD 7 indicated by the solid line (1-*c*) in FIG. 1.

According to the configuration in FIG. 1, to begin with, the drive current applied to the laser diode of the variable-wavelength light source section 1 is kept constant, whereby wide-range and stable output light wavelength accuracy is provided.

The characteristic of the output light of the variable-wavelength light source section 1 relative to the wavelength becomes the characteristic indicated by the solid line in (1-*a*) of FIG. 1.

A part of the output light of the variable-wavelength light source section 1 through the optical variable attenuator 2 and the photocoupler 3 to the outside of the light source unit is fed back.

To do this, split light of the photocoupler 3 is fed into the optical variable attenuator control circuit 4 through the optical power monitor PD 7 for changing the control voltage of the optical variable attenuator 2.

As the feedback control is performed, the characteristic of the output light from an output section of the light source unit relative to the wavelength should become a flat characteristic indicated by the solid line in (1-*b*) of FIG. 1.

However, since the photocoupler 3 and the optical power monitor PD 7 forming the feedback system also contain wavelength dependency as shown in (1-*c*) of FIG. 1, if the feedback control is simply performed, the accurately flat characteristic as in (1-*b*) of FIG. 1 is not provided.

In the feedback system, the optical variable attenuator control circuit 4 reads the value of the wavelength dependency correction table 5 and operates so as to cancel out the wavelength dependency of the photocoupler 3 and the optical power monitor PD 7, whereby the characteristic of the output light relative to the wavelength can be made flat as indicated by the solid line in (1-*b*) of FIG. 1.

If the feedback control is performed so that output of the photocoupler 3 and the optical power monitor PD 7 is simply made constant, the light output from the light source unit does not become constant because the photocoupler 3 and the optical power monitor PD 7 contain wavelength dependency.

To make the output constant, the wavelength dependency of the photocoupler 3 and the optical power monitor PD 7 is previously measured, a correction table is provided, and difference is given, whereby the wavelength dependency of the photocoupler 3 and the optical power monitor PD 7 can be canceled out.

As shown in FIG. 3, hops of output light wavelength caused by mode change of the oscillation state, called mode-hops, (discontinuous change) are hard to occur on principle in the variable-wavelength light source section having littman placement.

Figure 2:
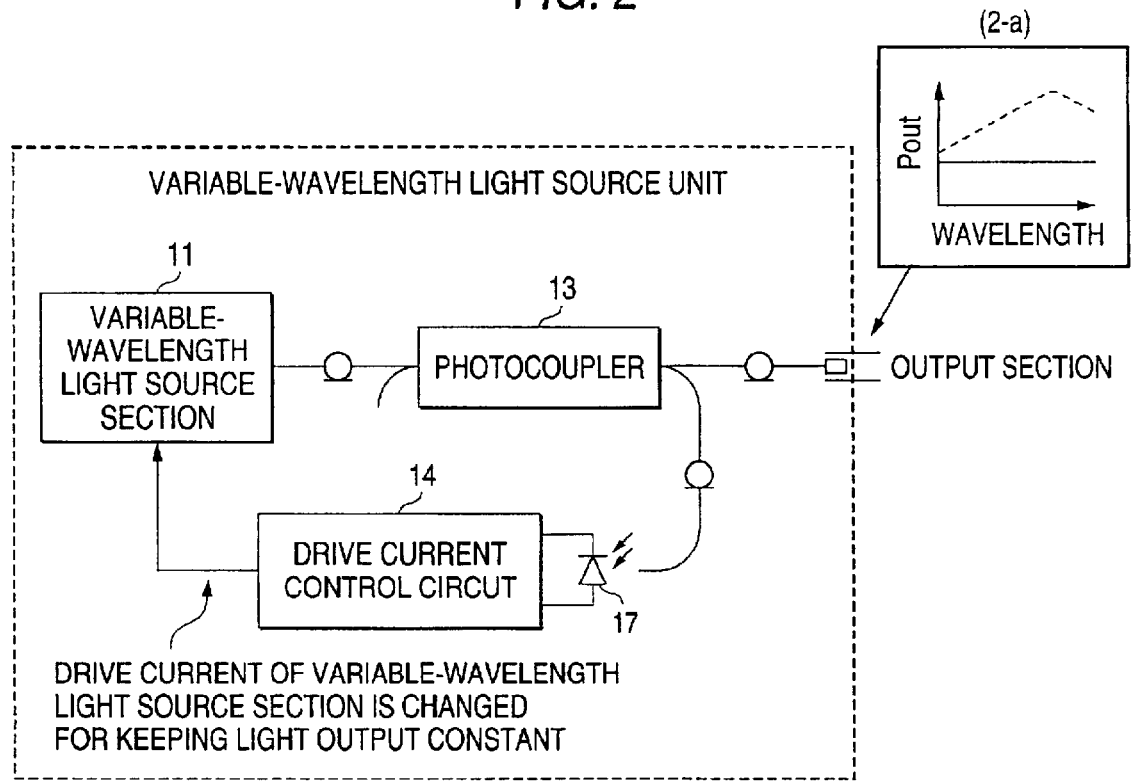
FIG. 2 is a drawing to show the configuration of a variable-wavelength light source unit in a related art.

However, if the variable-wavelength light source section in FIG. 3 is used to configure the variable-wavelength light source unit as shown in FIG. 2, mode-hops occur because the drive current of the laser diode is largely fluctuated as described above.

In contrast, the variable-wavelength light source unit of the invention drives the drive current of the laser diode by the constant-current circuit, so that occurrence of mode-hops can be minimized.

If mode-hops are eliminated, the wavelength of the output light can be continuously changed (swept).

Thus, when the continuous sweeping function of the wavelength of the output light is used to measure the wavelength dependency of optical parts used with optical communications, etc., it is also made possible to measure steeper wavelength change precisely.

As a specific example of the optical variable attenuator 2, an optical variable attenuator using a photoelectric effect element having transmissivity changed upon application of a voltage is available.

As compared with an optical variable attenuator having a mechanical structure, the optical variable attenuator using a photoelectric effect element can react to applied voltage change at high speed in light attenuation amount change.

Thus, such a photoelectric effect element of voltage applying drive type is adopted for the optical variable attenuator of the invention, whereby if the wavelength sweeping of the variable-wavelength light source is speeded up, it is made possible to correct the wavelength dependency following the speed, and the measuring time can be shortened.

According to the invention, the variable-wavelength light source unit for sending output light of an arbitrary wavelength selected in a variable-wavelength light source section 1 comprises:

an optical variable attenuator (optical variable attenuator) 2 on the output side of the variable-wavelength light source section; and a control circuit (optical variable attenuator control circuit) 4 for controlling the attenuation amount of the optical variable attenuator in response to light output provided by splitting a part of the output light. Thus, the variable-wavelength light source unit that can provide stable light output wavelength accuracy over a wide range of wavelengths while the light output level of the variable-wavelength light source unit is kept constant can be provided.

According to the invention, a semiconductor laser diode of the variable-wavelength light source section is driven by a constant current, whereby the drive current value of the semiconductor laser diode is constant, so that providing a wide range of wavelengths is not inhibited.

According to the invention, the control circuit performs feedback control in response to output light split by a photocoupler and includes a compensator for canceling out wavelength dependency of a feedback system. Thus, the wavelength dependency caused by the effect of the photocoupler 3, optical power monitor PD 7, etc., can be canceled out.

According to the invention, a characteristic for canceling out the wavelength dependency of the photocoupler and an optical power monitor photodiode forming the feedback system by the compensator is previously stored in a table. Thus, the wavelength dependency of the photocoupler 3, the optical power monitor PD 7, etc., can be easily canceled out.

According to the invention, to change the attenuation amount in the optical variable attenuator, the magnitude of the voltage superposed on the control voltage can also be changed for changing the level of the output light.

According to the invention, a photoelectric effect element of voltage applying drive type is used as the optical variable attenuator, whereby as compared with an optical variable attenuator having a mechanical structure, the photoelectric effect element can react to applied voltage change at high speed in light attenuation amount change.

Thus, if the wavelength sweeping of the variable-wavelength light source is speeded up, it is made possible to correct the wavelength dependency following the speed, and the measuring time can be shortened.

What is claimed is:

1. A variable-wavelength light source unit comprising:
    a variable-wavelength light source for selecting a wavelength of light and outputting the light having the wavelength;
    an optical variable attenuator for attenuating the light from the variable-wavelength light source section;
    a control circuit for controlling the attenuation amount of the light by the optical variable attenuator in response to a level of the light; and
    a photocoupler for splitting the light from the optical variable attenuator into output light and feedback light,
    wherein the control circuit performs feedback control in response to the feedback light split by the photocoupler.

2. The variable-wavelength light source unit as claimed in claim 1, wherein the variable-wavelength light source comprises a semiconductor laser diode for emitting light, and the semiconductor laser diode is driven by a constant current.

3. The variable-wavelength light source unit as claimed in claim 1, wherein the control circuit includes a compensator for canceling out wavelength dependency of a feedback portion of the unit.

4. The variable-wavelength light source unit as claimed in claim 3, wherein the compensator includes a table for storing in advance characteristics for canceling out the wavelength dependency of the photocoupler and the optical power monitor photodiode.

5. The variable-wavelength light source unit as claimed in claim 1, further comprising an optical power monitor photodiode for outputting an electric signal to the control circuit in response to the level of the feedback light.

6. The variable-wavelength light source unit as claimed in claim 1, wherein the attenuation amount in the optical variable attenuator is changed to the level of the light to be output.

7. The variable-wavelength light source unit as claimed in claim 1, wherein the optical variable attenuator is a photoelectric effect element of voltage applying drive type.

* * * * *